(12) United States Patent
Nakajima

(10) Patent No.: US 8,075,996 B2
(45) Date of Patent: Dec. 13, 2011

(54) CERAMIC SINTERED COMPACT AND PIEZOELECTRIC ELEMENT

(75) Inventor: Genei Nakajima, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 193 days.

(21) Appl. No.: 12/457,888

(22) Filed: Jun. 24, 2009

(65) Prior Publication Data

US 2009/0324954 A1 Dec. 31, 2009

(30) Foreign Application Priority Data

Jun. 30, 2008 (JP) ................. 2008-171713
Mar. 31, 2009 (JP) ................. 2009-085871

(51) Int. Cl.
*C01G 23/00* (2006.01)

(52) U.S. Cl. ........ 428/402; 428/688; 428/701; 428/702; 423/598; 117/947; 117/949

(58) Field of Classification Search ........................ None
See application file for complete search history.

(56) References Cited

U.S. PATENT DOCUMENTS

| | | | |
|---|---|---|---|
| 6,231,779 B1 | 5/2001 | Chiang et al. | |
| 2002/0158224 A1* | 10/2002 | Aoto et al. | 252/62.63 |
| 2004/0214723 A1* | 10/2004 | Nonoyama et al. | 505/100 |
| 2004/0231581 A1* | 11/2004 | Aoto et al. | 117/2 |
| 2010/0051079 A1* | 3/2010 | Majumdar et al. | 136/201 |

FOREIGN PATENT DOCUMENTS

| | | |
|---|---|---|
| EP | 1 860 079 A1 | 11/2007 |
| EP | 1 901 361 A2 | 3/2008 |
| JP | A-2007-277031 | 10/2007 |
| JP | A-2008-150247 | 7/2008 |

OTHER PUBLICATIONS

European Office Action issued in European Patent Application No. 09163958.3 dated Jan. 21, 2011.
Lin et al., "Piezoelectric and ferroelectric properties of lead-free [$Bi_{1-y}(Na_{1-x-y}Li_x)$]$0.5Ba_yTiO_3$ ceramics", *Journal of the European Ceramic Society*, Nov. 8, 2005, pp. 3247-3251, vol. 26, No. 15, Elsevier Science Publishers, Barking, Essex, GB.
Castro et al., "Synthesis and Characterization of Nb-Doped PZT Ferro-Piezoelectric Ceramics", *Materials and Manufacturing Processes*, pp. 301-310, vol. 15, No. 2, Marcel Dekker, Inc., 2000.
European Search Report issued in European Application No. 09163958.3 on Nov. 5, 2009.
Saito et al., "Lead-free piezoceramics," *Nature*, Nov. 2004, pp. 84-87, vol. 432.
Karaki et al., "Lead-Free Piezoelectric Ceramics with Large Dielectric and Piezoelectric Constants Manufactured from $BaTiO_3$ Nano-Powder," *Japanese Journal of Applied Physics*, 2007, pp. L97-L98, vol. 46, No. 4, The Japan Society of Applied Physics.

* cited by examiner

*Primary Examiner* — Jennifer McNeil
*Assistant Examiner* — Vera Katz
(74) *Attorney, Agent, or Firm* — Oliff & Berridge, PLC

(57) ABSTRACT

A ceramics sintered compact is provided in which a relative dielectric constant and an electromechanical coupling coefficient are improved in superior balance and which shows a relatively high piezoelectric coefficient. A ceramics sintered compact having a perovskite structure is provided in which a (002)/(200) ratio by X-ray diffraction after polarization is applied is 1.0 or greater.

5 Claims, 8 Drawing Sheets

CERAMIC SINTERED COMPACT AND PIEZOELECTRIC ELEMENT

FIELD

The present invention relates to a ceramics sintered compact which has a perovskite structure and a piezoelectric element which uses such a ceramics sintered compact.

BACKGROUND

In the related art, a barium titanate ceramics which is a lead-free piezoelectric ceramics is obtained by crashing and mixing barium carbonate ($BaCO_3$) and titanium oxide ($TiO_2$) and sintering for 4 hours under a temperature of 1300 degrees to 1400 degrees. However, in the barium titanate ceramics obtained in this manner, the Curie temperature which is a temperature in which the piezoelectric characteristic is lost is relatively low and a piezoelectric constant d33 is lower than 200 pm/V, and, thus, the ceramics is not practical.

In recent years, a composition of and a method of manufacturing a niobate-based ($KNbO_3$—$NaNbO_3$—$LiNbO_3$-based) ceramics having a relatively high piezoelectric characteristic have been found (Non-patent Document 1), and a structure has been obtained which is close to practical such as a Curie temperature of about 250° C. and a piezoelectric constant d33 of about 400 pm/V.

In addition, an example is known in which a barium titanate ($BaTiO_3$) powder of a nano-size material which is hydrothermally synthesized is sintered in a range of 1050° C. to 1200° C. to achieve a piezoelectric constant d33 which is close to 400 pm/V (Patent Document 1).

Moreover, an experimental example is known in which two stages of sintering is applied and a barium titanate ceramics is obtained in which the performance is improved (Non-patent Document 2).

CITATION LIST

Patent Literature

[Patent Document 1] JP 2007-277031 A

Non Patent Literature

[Non-patent Document 1] Y. Saito, H. Takao, T. Tani, T. Nonoyama, K. Takatori, T. Homma, T. Nagaya, and M. Nakamura, "Lead-free piezoceramics", Nature, 432, Nov. 4, 84-87 (2004)
[Non-patent Document 2] Tomoaki Karaki, Kang Yan, Toshiyuki Miyamoto, and Masatoshi Adachi, "Lead-Free Piezoelectric Ceramics with Large Dielectric and Piezoelectric Constants Manufactured from BaTiO3 Nano-Powder", Japanese Journal of Applied Physics, Vol. 46, No. 4, 2007, pp L97-L98

However, the technique disclosed in the Non-patent Document 1 has complex manufacturing steps. Although the technique enables manufacturing in an experimental environment, the technique is not suited for industrial manufacturing. In addition, although the barium titanate ceramics manufacturing by the method disclosed in the Patent Document 1 shows a relatively high value for the piezoelectric constant, this is due to a high relative dielectric constant. Thus, an electromechanical coupling coefficient k is not sufficiently increased, and the practical use of the ceramics is limited.

The present invention was conceived in view of the above-described circumstances, and an advantage of the present invention is that a ceramics sintered compact in which the relative dielectric constant and the electromechanical coupling coefficient are improved in superior balance and which shows a relatively high piezoelectric constant and a piezoelectric element which uses the ceramics sintered compacts are provided.

SUMMARY

According to one aspect of the present invention, there is provided a ceramics sintered compact having a perovskite structure, wherein a (002)/(200) ratio by X-ray diffraction after polarization is applied is 1.0 or greater.

DESCRIPTION OF EMBODIMENTS

A preferred embodiment of the present invention will now be described with reference to the drawings. A ceramics sintered compact according to a preferred embodiment of the present invention is obtained in the following manner.

First, a material powder of particle size 100 nm obtained by hydrothermal synthesis is prepared and an aqueous solution of polyvinyl alcohol in 5 wt % is prepared as a binder. The binder is added to the material powder in 1 wt % in the material powder ratio, and is pressure-formed into a desired shape (for example, a disc shape with a diameter of 12 mm and a thickness of 1.5 mm). The formation pressure in this process is set at about 200 MPa. Then, the formed structure is heated to a temperature of 600° C. and left for 2 hours, for debinding.

Figure 1:
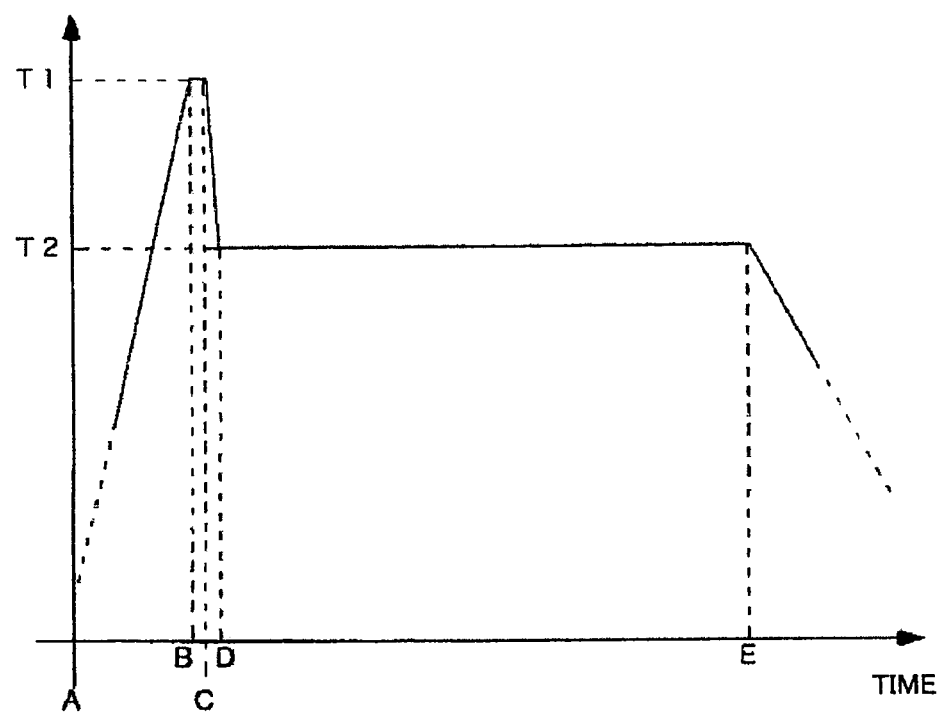
FIG. 1 is an explanatory diagram exemplifying a sintering condition of a ceramics sintered compact according to a preferred embodiment of the present invention.

The formed structure after debinding is sintered with the following conditions. As exemplified in FIG. 1, the temperature of the structure is increased to a first sintering temperature T1 with a temperature increasing rate of $\alpha°$ C./minute which is determined in advance (A-B), maintained for a predetermined time t1 (B-C), reduced to a second sintering temperature T2 (wherein T2<T1) with a temperature reducing rate of $\beta°$ C./minute which is determined in advance (C-D), and maintained for a predetermined time t2 (D-E). With this process, a ceramics sintered compact is obtained.

If the barium titanate ($BaTiO_3$), the niobate-based ($KNbO_3$—$NaNbO_3$—$LiNbO_3$-based) powder, or a bismuth sodium titanate-based ($BiO.5NaO.5TiO_3$-based) powder is selected as the material powder, the ceramics sintered compact would have a perovskite structure. The temperature reducing rate $\beta°$ C./minute is set to be greater than the temperature increasing rate $\alpha°$ C./minute ($|\beta|>|\alpha|$, wherein $|*|$ indicates the absolute value). The temperature increasing rate $\alpha$ is set to about 5° C./minute to 30° C./minute and, with regard to the temperature reducing rate $\beta$, $|\beta|>|\alpha|$, and the temperature reducing rate $\beta$ is set to about 10° C./minute to 50° C./minute. As an example, the temperature increasing rate $\alpha$ is stet to 10° C./minute and the temperature reducing rate $\beta$ is set to 30° C./minute. The time t1 is preferably set to a short time such as 0.5 minute-2 minutes. For example, the time t1 is set to 1 minute. The time t2 is preferably set to 1 hour to 15 hours, and is set, for example, to 4 hours.

The ceramics sintered compact is prepared, and both sides of the ceramics sintered compact are lap-polished, so that the structure is machined to a thickness of 1 mm. A silver (Ag) paste is applied to both sides of the machined ceramics sintered compact and is dried, to form an electrode. Then, the ceramics sintered compact is placed in silicon oil, and, for example, in the case of the barium titanate ($BaTiO_3$), a direct current electric field of 1.0 kV/mm is applied for 30 minutes, to apply a polarization process.

Figure 2:
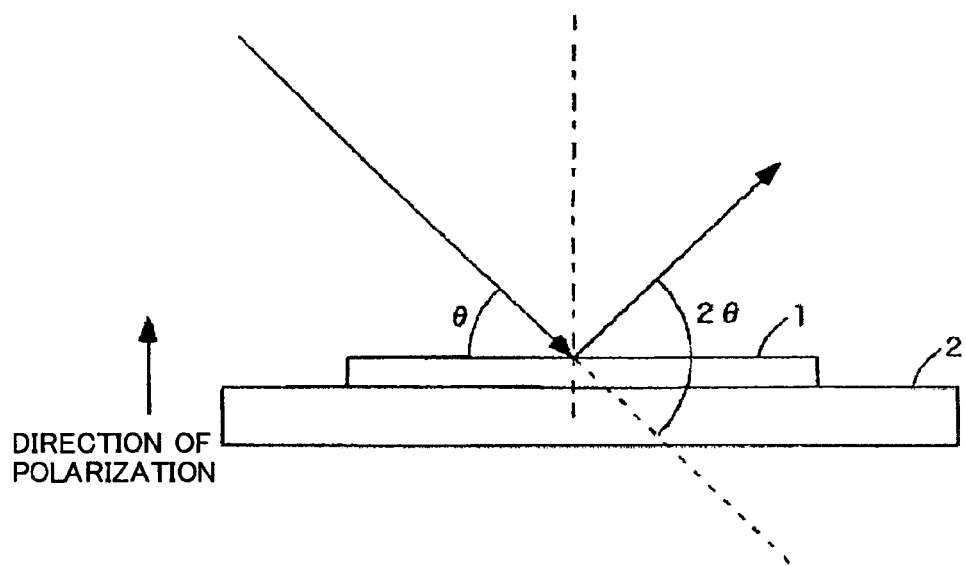
FIG. 2 is an explanatory diagram showing an example method of obtaining an X-ray diffraction image for a ceramics sintered compact according to a preferred embodiment of the present invention.

At least one ceramics sintered compact after the polarization process as described above is obtained, and a selection process is applied as follows. The electrode portion of the ceramics sintered compact after the polarization process is removed to obtain a sample for X-ray diffraction, and, as shown in FIG. 2, a sample for X-ray diffraction 1 is fixed to an X-ray diffraction sample holder 2. In this process, the sample is fixed with a surface, which is perpendicular to the direction of the polarization, facing the upward direction. Then, X-ray (for example, Cu—K$\alpha$ ray) is emitted to the surface facing the upward direction, and an amount of X-ray diffracted by the sample is counted for each diffraction angle using a wide angle goniometer.

Figure 3:
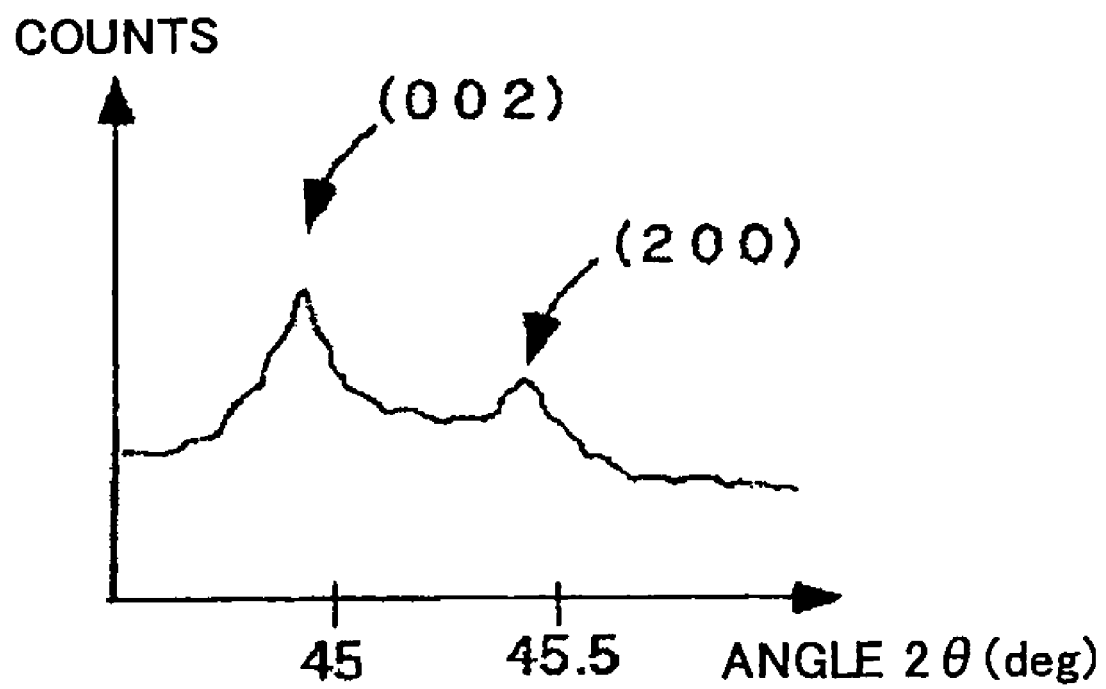
FIG. 3 is an explanatory diagram showing an example result of X-ray diffraction for a ceramics sintered compact according to a preferred embodiment of the present invention.

If the count value is plotted against the diffraction angle (2$\theta$ value), a diffraction pattern as exemplified in FIG. 3 is obtained. In this diffraction pattern, the count peak by the diffraction at the (002) plane and the count peak by the diffraction at the (200) plane are observed at the diffraction angles corresponding to the planes, and a ratio of the peaks of these count values, that is, the (002)/(200) strength ratio, is calculated.

When the (002)/(200) strength ratio measured in this process is not 1.0 or greater, the ceramics sintered compact which is the base of the sample for X-ray diffraction is discarded. With this process, a ceramics sintered compact having a perovskite structure with the (002)/(200) strength ratio of 1.0 or greater is obtained.

Alternatively, it is also possible to further obtain a half value of the peak of the count value at the (002) plane and measure the width of the peak in the (002) plane in the diffraction pattern at the half value as a (002) full width at half maximum (FWHM), and discard the ceramics sintered compact which is the base of the sample for X-ray diffraction when the measured (002)/(200) strength ratio is not 1.0 or greater or when the (002) full width at half maximum is not 0.12 or greater. With this process, a ceramics sintered compact having a perovskite structure with the (002)/(200) strength ratio of 1.0 or greater and (002) full width at half maximum of 0.12 or greater is obtained.

It is also possible to measure at both sides of the sample and to use an average value of the (002)/(200) strength ratios at the two sides as the measured value. Similarly, with regard to the (002) full width at half maximum, the measurement may be taken for both sides of the sample and an average value of the values of the two sides may be used as the measured value.

In addition, in the above description, the electrode is formed with a silver paste, the electrode portion of the ceramics after the polarization process is removed, and analysis by X-ray diffraction is applied. Alternatively, it is also possible to apply the polarization process in the following manner, to not require the removal of the electrode.

For instance, the ceramics sintered compact machined to a thickness of 1 mm by lap polishing is sandwiched on both sides by metal plates having the same planar shape as the planar shape of the ceramics sintered compact (that is, a same disc shape when the ceramics sintered compact has a disc shape), and the metal plates are fixed by pressing with a spring or the like from both sides. The structure is then placed in the silicon oil, and, for the case of the barium titanate ($BaTiO_3$), for example, a direct current electric field of 1.0 kV/mm is applied for 30 minutes, to apply the polarization process. The metal plate in this configuration may be, for example, stainless steel.

After the polarization process, the metal plates are detached and a sample for X-ray diffraction is obtained. As exemplified in FIG. 2, the sample for X-ray diffraction 1 is fixed on the X-ray diffraction sample holder 2. In this process, the sample is fixed with a surface, which is perpendicular to the direction of the polarization, facing the upward direction. Then, X-ray (for example, Cu—K$\alpha$ ray) is emitted to the surface facing the upward direction, and, using the wide angle goniometer, the amount of X-ray diffracted by the sample is counted for each diffraction angle. Normally, the piezoelectric characteristic also depends on the state of the material before sintering, and, thus, there are many parameters to be controlled such as the particle size distribution, moisture absorption, amount of impurity, etc. Of the methods described above, with the former method, the superiority is judged by the quality control method, but with the latter method, the piezoelectric characteristic can be easily predicted based on the measurement result of the X-ray diffraction. Therefore, the latter method has advantages that a material batch which does not have superior characteristic can quickly be judged and lot-out (stopping of shipping or the like) may be employed.

Figure 8:
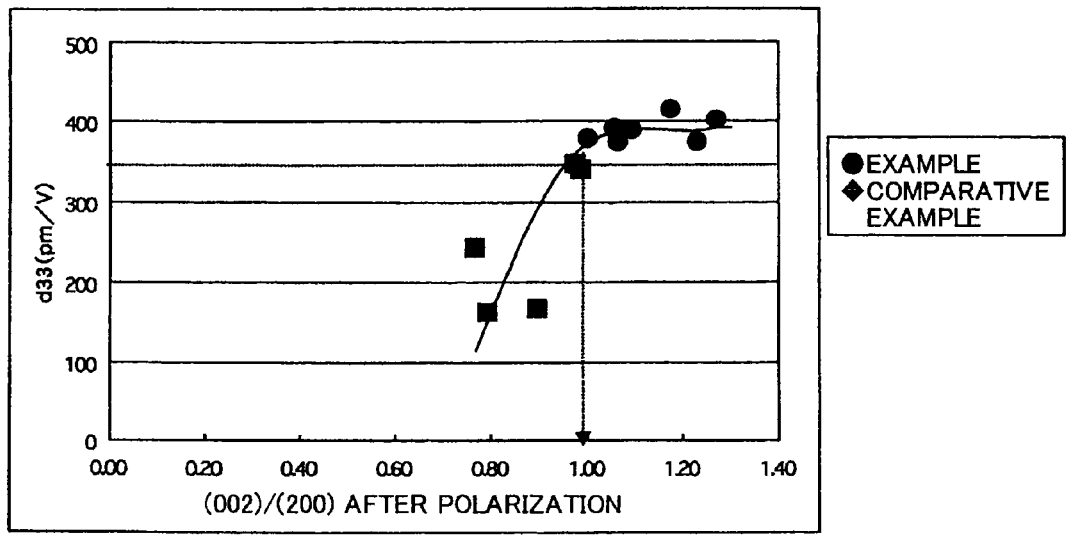
FIG. 8 is an explanatory diagram showing an example change of a value of a piezoelectric characteristic with respect to (002)/(200) strength ratio after polarization process in a ceramics sintered compact according to another aspect of preferred embodiment of the present invention.

A ferroelectric substance of perovskite structure thus obtained generally has a tetragonal system. When the ceramics sintered compact having the perovskite structure is analyzed with X-ray diffraction, diffractions due to (002) and (200) which are unique to the tetragonal systems appear. The diffraction position of (002) indicates a c-axis length and the diffraction position of (200) indicates an a-axis length. In general, the strength ratio of (002)/(200) is around 0.5 for the polycrystalline structure before polarization (random orientation). In the case of the tetragonal systems, because the direction of the self-polarization is in the c-axis direction, the piezoelectric characteristic does not appear in the state where the c-axis is randomly oriented. In order to obtain the piezoelectric characteristic, the diffraction strength of (002) after polarization must be increased and the c-axis must be aligned in the polarization direction. In other words, in the state after the polarization, it can be expected that the degree of self-polarization in the polarization direction depends on the strength ratio (002)/(200). As a result of experiments, the present inventors have found that, as shown in FIG. 8, the piezoelectric constant d33 is strongly correlated with (002)/(200) after polarization. Based on this knowledge, the present inventors have found that a sintered compact with a superior piezoelectric characteristic can be obtained by suitably controlling or managing the (002)/(200) value after polarization.

In addition, a wider (002) full width at half maximum means that a distribution is created in the c-axis length. In other words, a wide (002) full width at half maximum may indicate that the crystal lattice of the tetragonal system is distorted. The ions forming the lattice are deviated from the intrinsic positions where the energy is the most stable, and tend to move by an electric field or force from the outside.

The condition of the debinding and the condition of the sintering as described above may be controlled so that the relative density is 97% to 100% and the average particle size of the crystal grain is 1 μm to 10 μm. Here, the relative density is obtained by dividing the actual density of the ceramics sintered compact by a theoretical density. The relative density is a ratio of the value of the actual density with respect to the highest density value which can be achieved by sintering (theoretical value), and is represented in a percentage (%). For example, for the case of the ceramics sintered compact using barium titanate ($BaTiO_3$), the theoretical value is approximately 6.0. The theoretical density is determined in the following manner. Barium titanate has a tetragonal perovskite structure at the room temperature, and a volume $V_0$ of a unit lattice is $V_0=a^2c$ when lattice constants are a and c. Atoms that are included in the unit lattice are 1 atom of Ba, 1 atom of Ti, and 3 atoms of O. The weights of the atoms are values obtained by dividing the atomic weights by Avogadro's number, and the theoretical density is calculated as a value obtained by dividing a total weight of the atoms included in the unit lattice by the volume $V_0$ of the unit lattice.

EXAMPLES

Example I

Next, an example of the present invention will be described. Specifically, barium titanate powder having a particle size of 100 nm was prepared by hydrothermal synthesis and an aqueous solution of polyvinyl alcohol in 5 wt % was prepared as the binder. The binder was added in 1 wt % in the material powder ratio to the material powder, and the material powder was pressure-formed in a disc shape having a diameter of 12 mm and a thickness of 1.5 mm. The formation pressure was 200 MPa. The formed structure was heated to 600° C. and left for 2 hours, for debinding.

Then, as the condition of sintering, the first sintering temperature T1 was set to 1390° C. and the second sintering temperature T2 was set to 1190° C., the temperature of the formed structure was increased to the first sintering temperature T1 with a rate of 10° C./minute, maintained for 1 minute, reduced to the second sintering temperature T2 (wherein T2<T1) with a rate of 30° C./minute, and maintained for 4 hours.

The relative density and the particle size of the ceramics sintered compact thus obtained were 98% and 5 μm. Moreover, the ceramics sintered compact sintered under these conditions was machined so that the thickness was 1 mm, a Ag paste was applied to both sides of the disc and dried, and a silver electrode was formed. Then, the ceramics sintered compact was placed in silicon oil, a direct current electric field of 1.0 kV/mm was applied for 30 minutes, to apply the polarization process, and then, the electrode was removed, to obtain a ceramics sintered compact of the Example (hereinafter referred to as "Example 1-1").

A part of the Example 1-1 was taken out as a sample, and was fixed on an X-ray diffraction sample holder. Using Cu—Kα ray, the state of X-ray diffraction of the sample was evaluated using a wide angle goniometer. As the scan method, continuous scan was used, with a scan rate of 0.04 degrees/second and a sampling interval of 0.004 degrees. The scan range was set to 15 degrees to 100 degrees in the 2θ value. From the diffraction pattern obtained by the measurement, (002) and (200) peaks were extracted, and the (002)/(200) strength ratio and (002) full width at half maximum were measured. Measurements were taken for both sides of the sample and the average was set as the measured value.

A sample in which the (002)/(200) strength ratio after polarization process was 1.82 and the (002) full width at half maximum was 0.134° was selected. Then, for the ceramics sintered compact which is the base of the selected sample, a relative dielectric constant ∈33 (relative dielectric constant in the polarization direction after polarization) was measured with an LCR meter, and an electromechanical coupling coefficient Kp in a radial direction vibration of the ceramics sintered compact having the disc shape was measured through a resonance/anti-resonance method using an impedance analyzer device. Characteristic values were obtained with ∈33 of 3650 and Kp of 0.470. In Example 1-2, the first sintering temperature T1 was set to 1350° C. and the second sintering temperature T2 was set to 1190° C., and similar measurements were made. The piezoelectric constant d33 can be considered to be approximately $$d_{33} \propto K_p \cdot \sqrt{\in_{33}}$$ [Equation 1]

and is proportional to $K_p \cdot \sqrt{\in 33}$ (for example, in the Example 1-1, the value of $K_p \cdot \sqrt{\in 33}$ is 28.4 from the above-described values). However, the piezoelectric constant d33 may alternatively be measured by a d33 meter.

In addition, for purpose of comparison, ceramics sintered compacts were created through the following method.

For example, barium titanate powder having a particle size of 100 nm was prepared through hydrothermal synthesis, and an aqueous solution of polyvinyl alcohol in 5 wt % was prepared as the binder. The binder was added in 1 wt % in material powder ratio to the material powder and the material powder was pressure-formed in a disc shape having a diameter of 12 mm and a thickness of 1.5 mm. The formation pressure was 200 MPa. The formed structure was heated to 600° C. and left for 2 hours for debinding.

Then, as the condition of sintering, the temperature of the structure was increased to a sintering temperature T at 3° C./minute, and maintained for 4 hours. The ceramics sintered compact sintered under these conditions was machined to a thickness of 1 mm, a Ag paste was applied on both sides of the disc and dried, and a silver electrode was formed. Then, the ceramics sintered compact was placed in silicon oil, a direct current electric field of 1.0 kV/mm was applied for 30 minutes, to apply a polarization process.

The above-described operation was performed at each of T=1390° C., T=1300° C., and T=1200° C., and, for each case, the relative density, the particle size, the (002)/(200) strength ratio by X-ray diffraction after polarization process, the (002) full width at half maximum, the relative dielectric constant ∈33, and the electromechanical coupling coefficient Kp were measured (these examples will hereinafter be referred to as Comparative Example 1-1, Comparative Example 1-2, and Comparative Example 1-3, respectively).

Then other comparative examples were prepared. For those comparative examples, as the condition of sintering, the first sintering temperature T1 was set to 1450° C., 1420° C., and 1300° C., and the second sintering temperature T2 was set to 1190° C. The temperature of the structure was increased to the first sintering temperature T1 with a rate of 10° C./minute, maintained for 1 minute, reduced to the second sintering temperature T2 (wherein T2>T1) with a rate of 30° C./minute, and maintained for 4 hours (these examples will hereinafter be referred to as Comparative Example 1-4, Comparative Example 1-5, and Comparative Example 1-6, respectively).

Table 1 shows the results.
[Table 1]

The results are shown in graph in the following. First, the value of the relative dielectric constant ∈33 after polarization with respect to the (002)/(200) strength ratio after polarization process is shown.

Figure 4A:
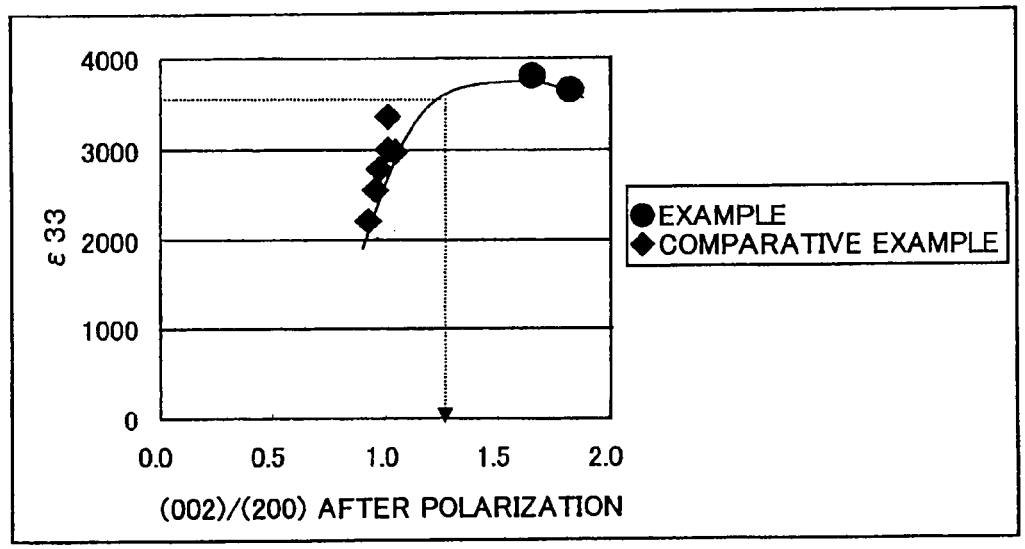
FIGS. 4A and 4B are explanatory diagrams showing an example of change of a value of a piezoelectric characteristic with respect to (002)/(200) strength ratio after polarization process in a ceramics sintered compact according to a preferred embodiment of the present invention.
Figure 4B:
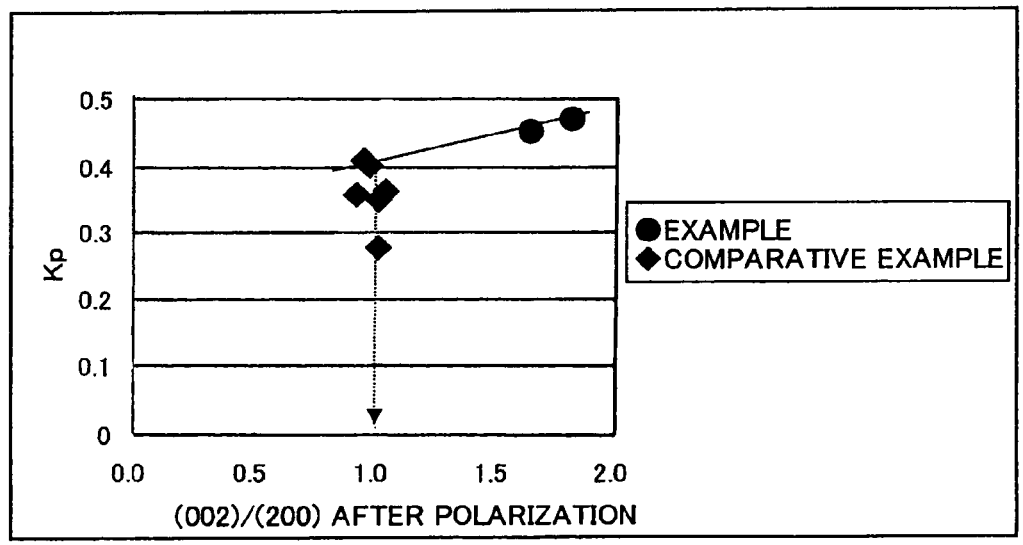

If the (002)/(200) strength ratio after polarization process does affect the piezoelectric characteristic because of the above-described reasons, the characteristic would be approximately equal at the same (002)/(200) strength ratio regardless of the condition of sintering. In consideration of this, the Examples 1-1 and 1-2 and Comparative Examples 1-1 to 1-6 were plotted in a graph of the relative dielectric constant ~33 against the (002)/(200) strength ratio after polarization process and in a graph of the electromechanical coupling coefficient K against the (002)/(200) strength ratio after polarization process. These graphs are shown in FIGS. 4A and 4B.

In order to obtain a characteristic in a practical level for a piezoelectric member, Kp·√∈33 of approximately 24 or greater (for example, the relative dielectric constant ∈33 of 3500 or greater and the electromechanical coupling coefficient Kp of 0.4 or greater) is required. In this case, based on the graphs of FIGS. 4A and 4B, the (002)/(200) strength ratio after polarization process must be at least 1.3 or greater in consideration of ∈33. Similarly, the (002)/(200) strength ratio after polarization process must be at least 1.0 or greater in consideration of Kp. In order to satisfy both conditions of the relative dielectric constant ∈33 of 3500 or greater and the electromechanical coupling coefficient Kp of 0.4 or greater, the (002)/(200) strength ratio after polarization process must be at least 1.3 or greater.

Figure 5A:
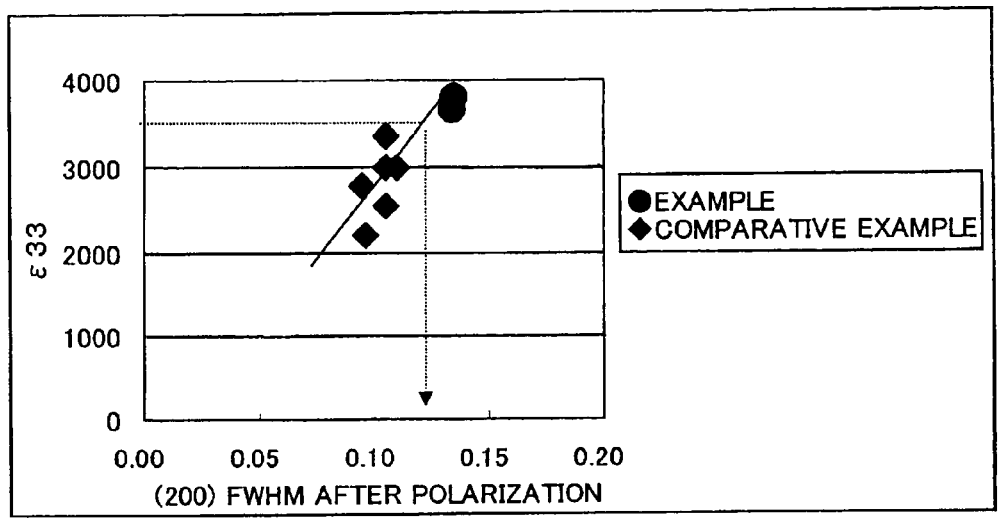
FIGS. 5A and 5B are explanatory diagrams showing an example change of a value of a piezoelectric characteristic with respect to a (002) full width at half maximum after polarization process in a ceramic sintered compact according to a preferred embodiment of the present invention.
Figure 5B:
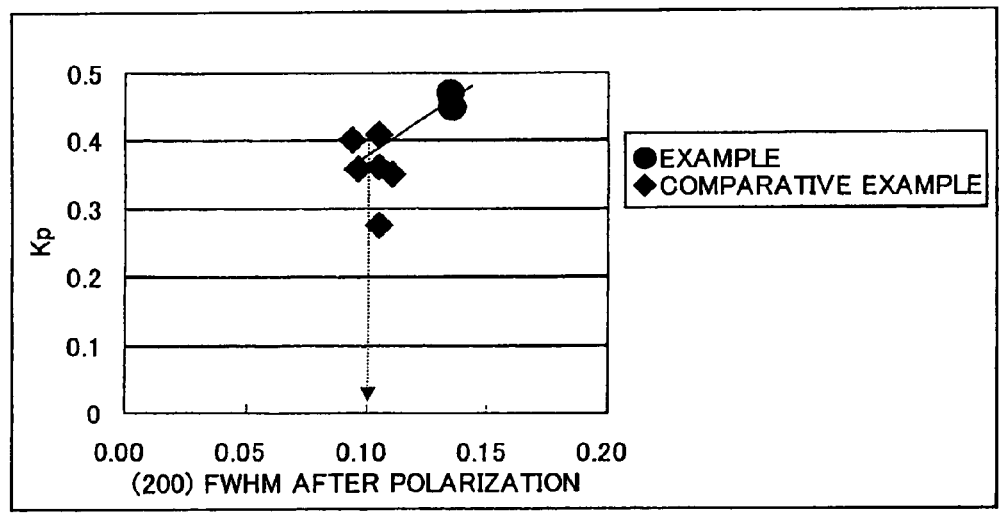

Similarly, a graph of the relative dielectric constant ∈33 against the (002) full width at half maximum and a graph of the electromechanical coupling coefficient Kp against the (002) full width at half maximum were plotted and are shown in FIGS. 5A and 5B. Here, similar to the above, the Kp·√∈33 of approximately 24 or greater (for example, relative dielectric constant ∈33 of 3500 or greater and electromechanical coupling constant Kp of 0.4 or greater) is required for a practical level of the piezoelectric member. In this case, based on the graphs shown in FIGS. 5A and 5B, the (002) full width at half maximum after polarization process must be at least 0.12 or greater in consideration of ∈33 and at least 0.10 or greater in consideration of Kp. In order to satisfy both conditions of the relative dielectric constant ∈33 of 3500 or greater and the electromechanical coupling coefficient Kp of 0.4 or greater, the (002) full width at half maximum after polarization process must be at least 0.12 or greater.

Figure 6A:
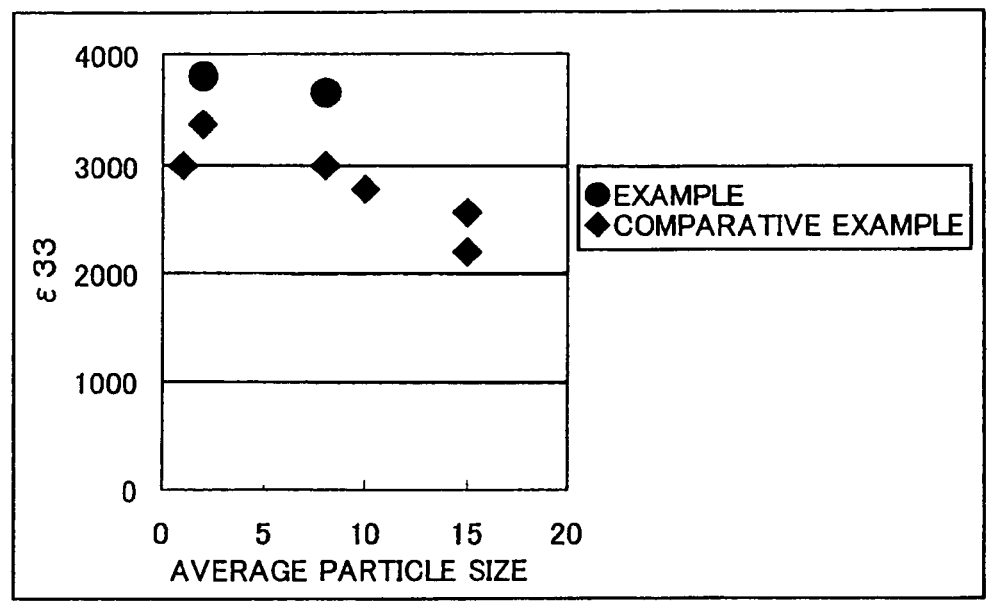
FIGS. 6A and 6B are explanatory diagrams showing an example change of a value of a piezoelectric characteristic with respect to an average particle size in a ceramics sintered compact according to a preferred embodiment of the present invention.
Figure 6B:
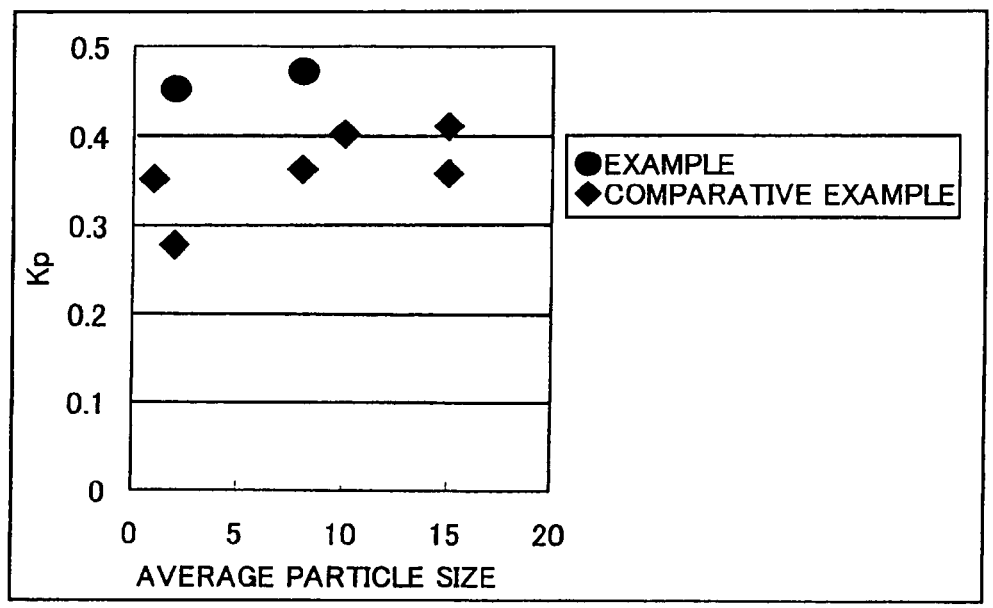

Changes of the relative dielectric constant ∈33 and of the electromechanical coupling coefficient Kp with respect to the average particle size are shown in FIGS. 6A and 6B. As shown in FIGS. 6A and 6B, in a range where the average particle size is less than 1 μm, although the relative dielectric constant ∈33 is high, the electromechanical coupling coefficient Kp is reduced, and, as a result, the piezoelectric constant d33 is not in the practical range. When the average particle size is greater than 10 μm, although the electromechanical coupling constant Kp does not change, the relative dielectric constant ∈33 is reduced, and, as a result, the piezoelectric constant d33 is not in the practical range in this case also.

According to FIGS. 6A and 6B, when the sintering conditions are set as in the Examples 1-1 and 1-2, a higher performance is achieved compared to the case where the sintering is applied with a single sintering temperature T for 4 hours. This is because, as shown in Table 1, in the Examples 1-1 and 1-2, the sintering progresses even though the particle size is relatively small, and, thus, the relative density is relatively high.

Figure 7A:
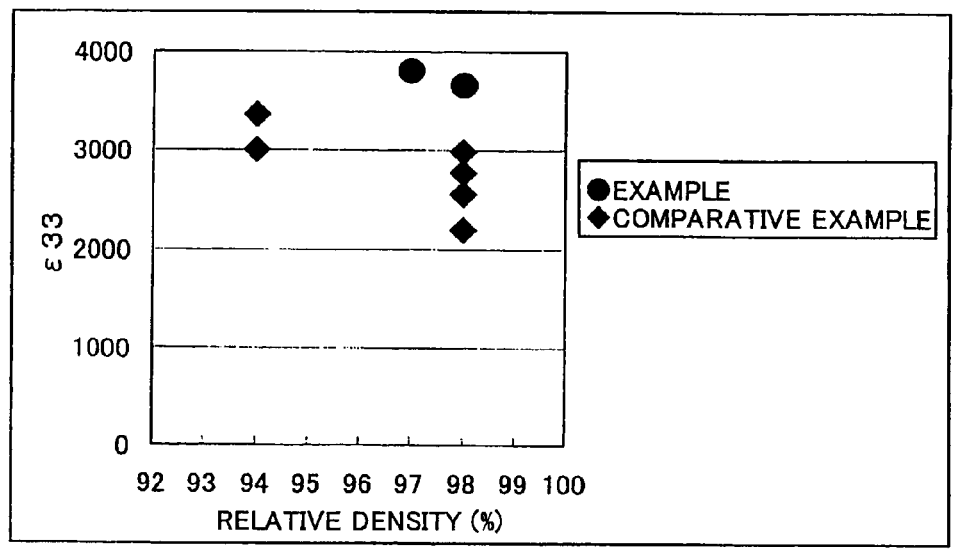
FIGS. 7A and 7B are explanatory diagrams showing an example change of a value of a piezoelectric characteristic with respect to a relative density of sintered compact in a ceramics sintered compact according to a preferred embodiment of the present invention.
Figure 7B:
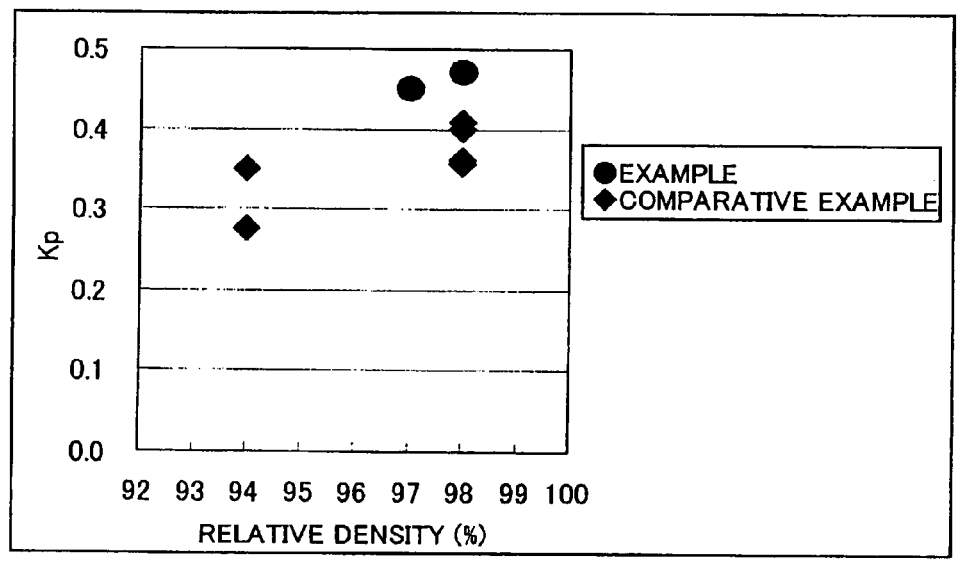

Changes of the relative dielectric constant ∈33 and of the electromechanical coupling constant Kp with respect to the relative density of the ceramics sintered compact are shown in FIGS. 7A and 7B. As shown in FIGS. 7A and 7B, as the relative density of the ceramics sintered compact becomes higher, the electromechanical coupling constant Kp becomes higher, and the relative dielectric constant ∈33 is quickly reduced in a range of relatively high density. Therefore, the relative density of the ceramics sintered compact is increased (for example, to relative density of 97% or greater), to increase the electromechanical coupling coefficient Kp while setting the average particle size to a range from 1 μm to 10 μm. With such a configuration, the piezoelectric constant d33 can be improved.

If the (002)/(200) strength ratio and/or the (002) full width at half maximum after polarization process do affect the piezoelectric characteristic as described above, it can be deduced that the state where the ions forming the crystal can be easily moved by an electric field or a force from the outside improves the relative dielectric constant ∈33, the elastic constant S, and the electromechanical coupling coefficient Kp, and consequently, improves the piezoelectric constant d33. From the deduction above, the characteristic would be approximately equal with equal (002)/(200) strength ratio and/or equal (002) full width at half maximum regardless of the sintering conditions.

Therefore, the ceramics sintered compact of the present embodiment is not limited to those obtained by the manufacturing method described above, and may be any other ceramics sintered compact as long as the structure can achieve the density of the sintered compact, the average particle size of the crystal particle, and (002)/(200) strength ratio and/or the (002) full width at half maximum of X-ray diffraction after polarization. For example, a structure may be manufactured through a spark plasma sintering (SPS) in which sintering is applied with a large spark current and uniaxial pressurization. However, in the current state, it is desirable to employ a sintering method having a sintering pattern in which the temperature is relatively quickly increased (for example, with a temperature increasing rate a of 5° C./minute to 30° C./minute) to a predetermined temperature, sintering is applied for a very short time (for example, 30 seconds to 2 minutes), the temperature is reduced to a predetermined temperature with a rate faster than the temperature increasing rate a (for example, with a temperature reducing rate β wherein |β|>|α| and β is 10° C./minute to 50° C./minute), sintering is applied at the predetermined temperature for a predetermined time period (for example, 1 hour to 15 hours), and the structure is gradually cooled.

Example II

Another Example will be described. A barium titanate powder having a particle size of 100 nm was prepared through hydrothermal synthesis, and an aqueous solution of polyvinyl alcohol of 5 wt % was prepared as a binder. The binder was added in 1 wt % in material powder ratio to the material powder and the material powder was pressure-formed to a disc shape with a diameter of 12 mm and a thickness of 1.5 mm. The formation pressure was 200 MPa. The formed structure was heated to 600° C. and left for 2 hours, for debinding.

Then, as the sintering condition, the first sintering temperature T1 was set to 1350° C., the temperature was increased to the first sintering temperature T1 with a rate of 10° C./minute, maintained for one minute, reduced to the room temperature (25° C.) with a rate of 30° C./minute, and maintained for 4 hours.

A ceramics sintered compact sintered under these conditions was machined to a thickness of 1 mm, and the front side and back side of the disc of the ceramics sintered compact were sandwiched with stainless electrodes having the same size as the disc and the electrodes were fixed by pressure with a spring or the like from both sides. The structure was then placed in silicon oil, a direct current electric field of 1.0 kV/mm was applied for 30 minutes, to apply a polarization process, and a ceramics sintered compact according to the present example (hereinafter referred to as "Example 2-1") was obtained. Structures obtained with similar processes with T1=1370° C. and T1=1390° C. (Examples 2-2 and 2-3) and structures obtained with similar processes with T1=1310° C. and T1=1330° C. (Comparative Examples 2-1 and 2-2) were also obtained.

After the polarization process, the metal plates were removed, to obtain a sample for X-ray diffraction 1, and the X-ray diffraction sample 1 was fixed on the X-ray diffraction sample holder 2 as exemplified in FIG. 2. The sample was fixed with a surface, which is perpendicular to the direction of polarization, facing the upward direction. X-ray (Cu—Kα ray) was emitted to the surface facing upward direction, and an amount of X-ray diffracted by the sample was counted for each diffraction angle using the wide angle goniometer.

The scan method was continuous scan, with a scan rate of 0.04 degrees/second and a sampling interval of 0.004 degrees. The scan range was set to 15 degrees to 100 degrees in 2θ value. From the diffraction pattern obtained in the measurement, the (002) peak and the (200) peaks were extracted and the (002)/(200) strength ratio was measured. Measurement was made on both sides of the sample and the average was set as the measured value.

A structure having the (002)/(200) strength ratio after polarization process of 1.0 or greater was selected as the Example. Then, for the ceramics sintered compact which is the base of the selected sample, the relative dielectric constant ∈33 (relative dielectric constant in the polarization direction after polarization) was measured with an LCR meter, and the electromechanical coupling constant Kp of the radial direction vibration of the ceramics sintered compact which is in the disc shape was measured through resonance/anti-resonance method using an impedance analyzer device. Moreover, the value of d33 was directly measured using a d33 meter (manufactured by Chinese Academy of Sciences, Laboratory of Voice and Music; Model ZJ-6B). The relative density and the particle size were also measured. Table 2 shows the results of these measurements.

[Table 2]

In Table 2, the values of d33 in Comparative Examples 2-1 and 2-2 are less than 350 pm/V while the values of d33 in Examples 2-1, 2-2, and 2-3 are 350 pm/V or greater.

Moreover, another example structure (Example 2-4) was obtained by a process in which, as the sintering conditions, the first sintering temperature T1 was set to 1330° C. and the second sintering temperature T2 was set to 1150° C., the temperature was increased to the first sintering temperature T1 with a rate of 10° C./minute, maintained for one minute, reduced to the second sintering temperature T2 (wherein T2<T1) with a rate of 30° C./minute, and maintained for 4 hours. Furthermore, other examples (Examples 2-5, 2-6, and 2-7) were obtained through similar processes with T1 set to 1350° C., 1370° C., and 1390° C., respectively. For each of these examples, the (002)/(200) strength ratio after polarization, ∈33, Kp, d33, relative density, and particle size were measured (similarly in the following). The results are shown also in Table 2.

Table 2 also shows example structures where T1 was set to 1310° C. (Comparative Example 2-3) and T1 was set to 1330° C. or 1390° C. and the temperature was maintained for 4 hours (Comparative Examples 2-4 and 2-5). In these configurations also, structures having the (002)/(200) strength ratio after polarization process of 1.0 or greater were selected as Examples. In Table 2, while the value of d33 is less than 350 pm/V for the Comparative Examples, the value of d33 is 350 pm/V or greater for the Examples.

Figure 9:
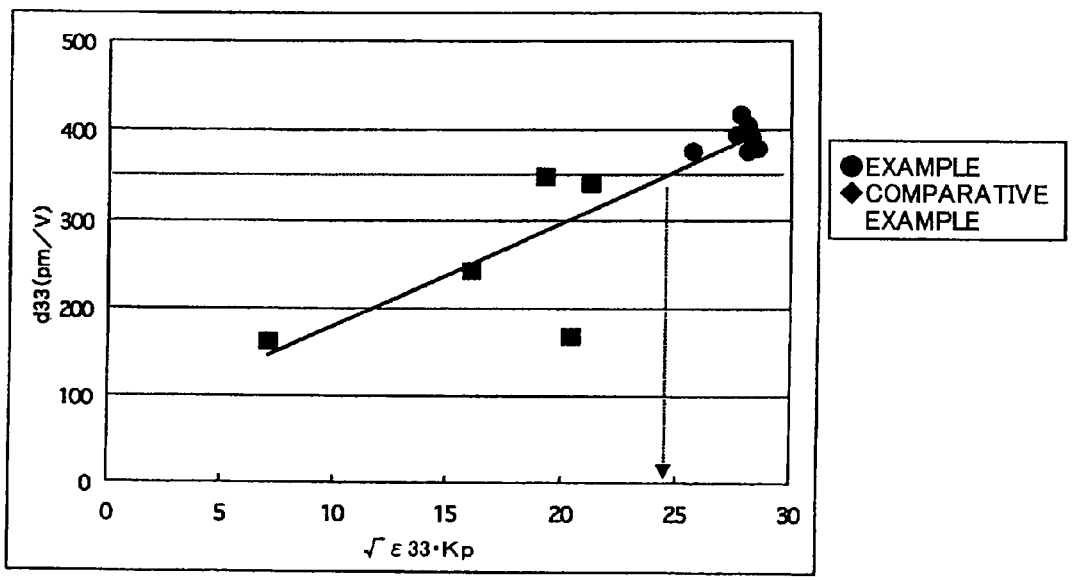
FIG. 9 is an explanatory diagram showing a correlation between a piezoelectric constant d33 and $Kp \cdot \sqrt{\in 33}$ in another aspect of preferred embodiment of the present invention.

In Example I, the value of the piezoelectric constant d33 was determined replacing with Kp·√∈33 (which is proportional to d33). In Example II, the value of d33 was actually measured with the d33 meter and the value of Kp·√∈33 was also determined. FIG. 9 shows the result of Table 2 with the piezoelectric constant d33 represented in the vertical axis and Kp·√∈33 represented in the horizontal axis. As shown in FIG. 9, when the value of the piezoelectric constant d33 is 350 pm/V, the value of Kp·√∈33 is 24 or greater, and it can be seen that there is a correlation between these values. In other words, it can be said that when the piezoelectric constant d33 is 350 pm/V or greater, a characteristic in the practical level can be achieved.

Next, when the relationship between the average particle size and the d33 value is considered based on Table 2, it can be understood that, in the comparative Example with an average particle size of 1 μm, although the relative dielectric constant ∈33 is high, the electromechanical coupling coefficient Kp is reduced, and, as a result, the piezoelectric constant d33 is less than 350 pm/V. In the Examples, on the other hand, when the average particle size is 1 μm or greater, the relative dielectric constant ∈33 is maintained at a high value and the electromechanical coupling coefficient Kp has an overall high value, and, thus, a superior result is obtained in which the piezoelectric constant d33 is 350 pm/V or greater. In addition, when the average particle size is greater than 10 μm, the relative dielectric constant ∈33 and the electromechanical coupling coefficient Kp are both reduced, and, consequently, the piezoelectric constant d33 is not in the practical range.

With respect to the relative density of the ceramics sintered compact, in the Examples, the relative density of ceramics sintered compact of 97% is obtained and the piezoelectric constant d33 is 350 pm/V or greater. Therefore, in this example also, the relative density of the ceramics sintered compact can be increased (to relative density of 97% or greater), to increase the electromechanical coupling coefficient Kp, and the average particle size can be set in a range of 1 μm to 10 μm, so that the piezoelectric constant d33 can be improved.

If the (002)/(200) strength ratio after polarization process does affect the piezoelectric characteristic because of the above-described reasons, an approximate equal characteristic can be obtained with the same (002)/(200) strength ratio regardless of the sintering conditions. In consideration of this, for the Examples and Comparative Examples, a graph of d33 against the (002)/(200) strength ratio after polarization process was plotted and shown in FIG. 8.

Here, in order to obtain a characteristic in a practical level for a piezoelectric member, the piezoelectric constant d33 must be 350 pm/V or greater. In this case, based on the graph shown in FIG. 8, in consideration of ∈33, the (002)/(200) strength ratio after polarization process must be at least 1.0 or greater.

Therefore, the ceramics sintered compact of the present example is not limited to the structure obtained through the above-described manufacturing method, as long as the density of the sintered compact, the average particle size of the crystal particle, and the (002)/(200) strength ratio by X-ray diffraction after polarization can be achieved. For example, a spark plasma sintering (SPS) in which sintering is applied with a large spark current and a uniaxial pressure may be considered. However, in the current state, a sintering method is desirable which has a sintering pattern in which the temperature is increased to the first sintering temperature (T1) with a relatively high rate (with a temperature increasing rate a of 5° C./minute to 30° C./minute), sintering process is applied for a very short time (for example, t1=30 seconds to 2 minutes), the temperature is reduced to the second sintering temperature (T2) with a temperature change which is greater than the temperature increasing rate (for example, the temperature reducing rate β satisfies |β|>|α| and is 10° C./minute to 50° C./minute) (|β|>|α|), the temperature is maintained for a predetermined period (for example, t2=1 hour to 15 hours) at the second sintering temperature, and the structure is then gradually cooled.

In addition, based on the results of Examples I, II, etc., it can be understood that the preferable conditions for the sintering method are selected from the first sintering temperature T1 of 1330° C.-1390° C. or 1350° C.-1390° C., the second sintering temperature T2 of room temperature (25° C.)-1190° C., the temperature increasing rate α of 5° C./minute to 30° C./minute, the temperature reducing rate β of |β|>|α| and 10° C./minute to 50° C./minute, a short sintering time t1 of 0.5 minute to 2 minutes, and a predetermined maintaining time t2 of 1 hour to 15 hours. However, based on the result of Example II, a desired characteristic can be achieved with a sintering pattern in which sintering is applied for a short time (t1) and the temperature is quickly reduced to the room temperature (25° C.) and maintained. Based on this knowledge, it can be considered that the process of maintaining at the second sintering temperature (T2) for a predetermined time is not a necessary step, and that it is more important to have the step of quickly increasing the temperature to the first sintering temperature, sintering for a short time, and quickly reducing the temperature.

As described, the ceramics sintered compact according to one aspect of the present invention is a ceramics sintered compact having a perovskite structure wherein a (002)/(200) ratio by X-ray diffraction after polarization is applied is 1.0 or greater.

It is also preferable that, in the ceramics sintering structure, a (002) full width at half maximum by the X-ray diffraction after polarization is applied is 0.12 or greater.

It is also preferable that, in the ceramics sintered compact, a relative density obtained by dividing an actual density of the sintered compact by a theoretical density is 97% to 100% and an average particle size of crystal particle is 1 μm to 10 μm.

Examples of lead-free ceramics having the perovskite structure include barium titanate ($BaTiO_3$), niobate-based ($KNbO_3$—$NaNbO_3$—$LiNbO_3$-based) powder, and bismuth sodium titanate-based powder ($BiO.5NaO.5TiO_3$). Of these, barium titanate ($BaTiO_3$) is desirable.

It is preferable that a method of manufacturing the ceramics sintered compact includes a sintering step of quickly increasing a temperature to a first sintering temperature of 1330° C.-1390° C., sintering for a short time of 2 minutes or less, and quickly reducing the temperature.

TABLE 1

|  | SINTERING TEMPERATURE ° (C.) | RELATIVE DENSITY (%) | PARTICLE SIZE (μm) | (002)/(200) | (002)FWHM (°) | ∈ 33 | Kp | Kp √ ∈ 33 |
|---|---|---|---|---|---|---|---|---|
| COMPARATIVE EXAMPLE 1-1 | 1390 | 98 | 15 | 0.92 | 0.096 | 2196 | 0.357 | 16.7 |
| COMPARATIVE EXAMPLE 1-2 | 1300 | 98 | 8 | 1.04 | 0.105 | 2984 | 0.362 | 19.7 |
| COMPARATIVE EXAMPLE 1-3 | 1200 | 94 | 2 | 1.01 | 0.105 | 3361 | 0.276 | 16.0 |
| COMPARATIVE EXAMPLE 1-4 | 1450/1190 | 98 | 15 | 0.95 | 0.105 | 2550 | 0.410 | 20.7 |
| COMPARATIVE EXAMPLE 1-5 | 1420/1190 | 98 | 10 | 0.97 | 0.094 | 2778 | 0.401 | 21.6 |
| COMPARATIVE EXAMPLE 1-6 | 1300/1190 | 94 | 1 | 1.01 | 0.110 | 3000 | 0.350 | 19.0 |
| EXAMPLE 1-1 | 1390/1190 | 98 | 8 | 1.82 | 0.134 | 3650 | 0.470 | 28.4 |
| EXAMPLE 1-2 | 1350/1190 | 97 | 2 | 1.65 | 0.135 | 3800 | 0.450 | 27.7 |

TABLE 2

|  | SINTERING TEMPERATURE T1/T2 ° (C.) | RELATIVE DENSITY (%) | PARTICLE SIZE (μm) | (002)/(200) | ∈ 33 | Kp | Kp √ ∈ 33 | d33 (pm/V) |
|---|---|---|---|---|---|---|---|---|
| COMPARATIVE EXAMPLE 2-1 | 1310/25 | 91 | 1 | 0.79 | 4158 | 0.11 | 7.1 | 164 |
| COMPARATIVE EXAMPLE 2-2 | 1330/25 | 95 | 1 | 0.99 | 4380 | 0.32 | 21.2 | 340 |
| EXAMPLE 2-1 | 1350/25 | 97 | 2 | 1.23 | 3924 | 0.41 | 25.7 | 375 |
| EXAMPLE 2-2 | 1370/25 | 97 | 3 | 1.27 | 3724 | 0.46 | 28.1 | 404 |
| EXAMPLE 2-3 | 1390/25 | 98 | 5 | 1.18 | 3645 | 0.46 | 27.8 | 417 |
| COMPARATIVE EXAMPLE 2-3 | 1310/1150 | 96 | 1 | 0.90 | 5317 | 0.28 | 20.4 | 168 |
| EXAMPLE 2-4 | 1330/1150 | 98 | 1 | 1.06 | 4931 | 0.4 | 28.1 | 376 |

TABLE 2-continued

|  | SINTERING TEMPERATURE T1/T2 ° (C.) | RELATIVE DENSITY (%) | PARTICLE SIZE (μm) | (002)/(200) | ε 33 | Kp | Kp √ ε 33 | d33 (pm/V) |
|---|---|---|---|---|---|---|---|---|
| EXAMPLE 2-5 | 1350/1150 | 98 | 2 | 1.09 | 4340 | 0.43 | 28.3 | 390 |
| EXAMPLE 2-6 | 1370/1150 | 98 | 3 | 1.00 | 4198 | 0.44 | 28.5 | 379 |
| EXAMPLE 2-7 | 1390/1150 | 99 | 8 | 1.05 | 3769 | 0.45 | 27.6 | 393 |
| COMPARATIVE EXAMPLE 2-4 | 1330/1330 | 99 | 15 | 0.97 | 3601 | 0.32 | 19.2 | 348 |
| COMPARATIVE EXAMPLE 2-5 | 1390/1390 | 99 | 13 | 0.77 | 3041 | 0.29 | 16.0 | 243 |

The invention claimed is:

1. A polarized ceramics sintered compact having a tetragonal perovskite structure, wherein the sintered compact has:

a (002) full width at half maximum by X-ray diffraction that is equal to or greater than 0.12 degrees;

a (002)/(200) ratio by X-ray diffraction that is equal to or greater than 1.0;

a relative density, obtained by dividing an actual density by a theoretical density of the sintered compact, that is from 97% to 100%; and an average crystal particle size of from 1 μm to 10 μm.

2. A piezoelectric element comprising the polarized ceramics sintered compact according to claim 1.

3. The polarized ceramics sintered compact according to claim 1, obtained by a sintering process comprising:

sintering while increasing a sintering temperature at a temperature increasing rate ($\alpha$) to a first sintering temperature ($T_1$) of from 1330° to 1390° C.;

sintering at the first sintering temperature ($T_1$) for a period of time of from 30 seconds to 2 minutes; and reducing the sintering temperature at a temperature reducing rate ($\beta$), wherein $|\beta|>|\alpha|$.

4. The polarized ceramics sintered compact according to claim 1, wherein the ceramics sintered compact is obtained by sintering a powder selected from the group consisting of barium titanate ($BaTiO_3$), a niobate-based ($KnbO_3$—$NaNbO_3$—$LiNbO_3$ based) powder, and a bismuth titanate-based ($Bi0.5Na0.5TiO_3$ based) powder.

5. A polarized ceramics sintered according to claim 1, wherein the sintered compact has a piezoelectric constant ranging from 375 to 417 pm/V.

* * * * *